(12) United States Patent
Gubbens et al.

(10) Patent No.: US 8,698,093 B1
(45) Date of Patent: Apr. 15, 2014

(54) OBJECTIVE LENS WITH DEFLECTOR PLATES IMMERSED IN ELECTROSTATIC LENS FIELD

(75) Inventors: Alexander J. Gubbens, Redwood City, CA (US); Ye Yang, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 1867 days.

(21) Appl. No.: 11/716,768

(22) Filed: Mar. 12, 2007

Related U.S. Application Data

(60) Provisional application No. 60/881,319, filed on Jan. 19, 2007.

(51) Int. Cl.
*G21K 5/04* (2006.01)

(52) U.S. Cl.
USPC .............................. 250/396 ML; 250/396 R

(58) Field of Classification Search
USPC ...... 250/396 ML, 305, 306, 307, 310, 396 R, 250/397, 398
See application file for complete search history.

(56) References Cited

U.S. PATENT DOCUMENTS

| | | | |
|---|---|---|---|
| 3,896,258 A | 7/1975 | Hanks | |
| 4,827,125 A | 5/1989 | Goldstein | |
| 4,926,054 A | 5/1990 | Frosien | |
| 5,311,028 A * | 5/1994 | Glavish | 250/396 ML |
| 5,598,002 A | 1/1997 | Todokoro et al. | |
| 5,650,628 A * | 7/1997 | Gordon et al. | 250/398 |
| 5,973,323 A | 10/1999 | Adler et al. | |
| 6,037,589 A | 3/2000 | Yonezawa et al. | |
| 6,087,659 A | 7/2000 | Adler et al. | |
| 6,104,034 A | 8/2000 | Frosien et al. | |
| 6,191,429 B1 | 2/2001 | Suwa | |
| 6,211,518 B1 | 4/2001 | Richardson et al. | |
| 6,215,128 B1 | 4/2001 | Mankos et al. | |
| 6,380,546 B1 | 4/2002 | Petrov et al. | |
| 6,392,231 B1 | 5/2002 | Chen | |
| 6,407,387 B1 | 6/2002 | Frosien et al. | |
| 6,509,750 B1 | 1/2003 | Talbot et al. | |
| 6,515,287 B2 | 2/2003 | Notte, IV | |
| 6,710,340 B2 | 3/2004 | Kazumori | |
| 6,720,557 B2 | 4/2004 | Frosien | |
| 6,858,843 B1 | 2/2005 | Mankos et al. | |
| 2004/0046125 A1* | 3/2004 | Chen | 250/396 ML |
| 2004/0056207 A1* | 3/2004 | Petrov et al. | 250/396 ML |
| 2005/0139773 A1* | 6/2005 | Ose et al. | 250/311 |

OTHER PUBLICATIONS

Min Cheng, et al. "Optimization design of immersion magnetic lenses in projection electron beam lithography" International Journal for light and electron optics; Jan. 24, 2001, pp. 149-151; Jiaotong University, P.R. China.

(Continued)

*Primary Examiner* — Nicole Ippolito
(74) *Attorney, Agent, or Firm* — Okamoto & Benedicto LLP

(57) ABSTRACT

One embodiment relates to an objective lens utilizing magnetic and electrostatic fields which is configured to focus a primary electron beam onto a surface of a target substrate. The objective lens includes a magnetic pole piece and an electrostatic deflector configured within the pole piece. An electrostatic lens field is determined by the pole piece and the electrostatic deflector, and the electrostatic lens field is configured by adjusting offset voltages applied to plates of the electrostatic deflector. Other embodiments, aspects and features are also disclosed.

18 Claims, 3 Drawing Sheets

(56) References Cited

OTHER PUBLICATIONS

Min Cheng, et al. "Study on wide beam curved optical axes focusing for magnetic immersed lenses without crossovers" International Journal for light and electron optics; May 28, 2000, pp. 509-513; Jiaotong University, P.R. China.

Min Cheng, et al. "Curvilinear-axis focusing and aberration theory of wide electron beams for combined immersion magnetic-electrostatic lens systems" International Journal for light and electron optics; Feb. 5, 2001 pp. 259-267; Jiaotong University, P.R. China.

M. Mankos, et al. "Multisource optimization of a column for electron lithography" J.Vac. Sci. Technology B, Nov./Dec. 2000, pp. 3010-3016, vol. 18, No. 6; Etec Systems, Hayward, California U.S.A.

* cited by examiner

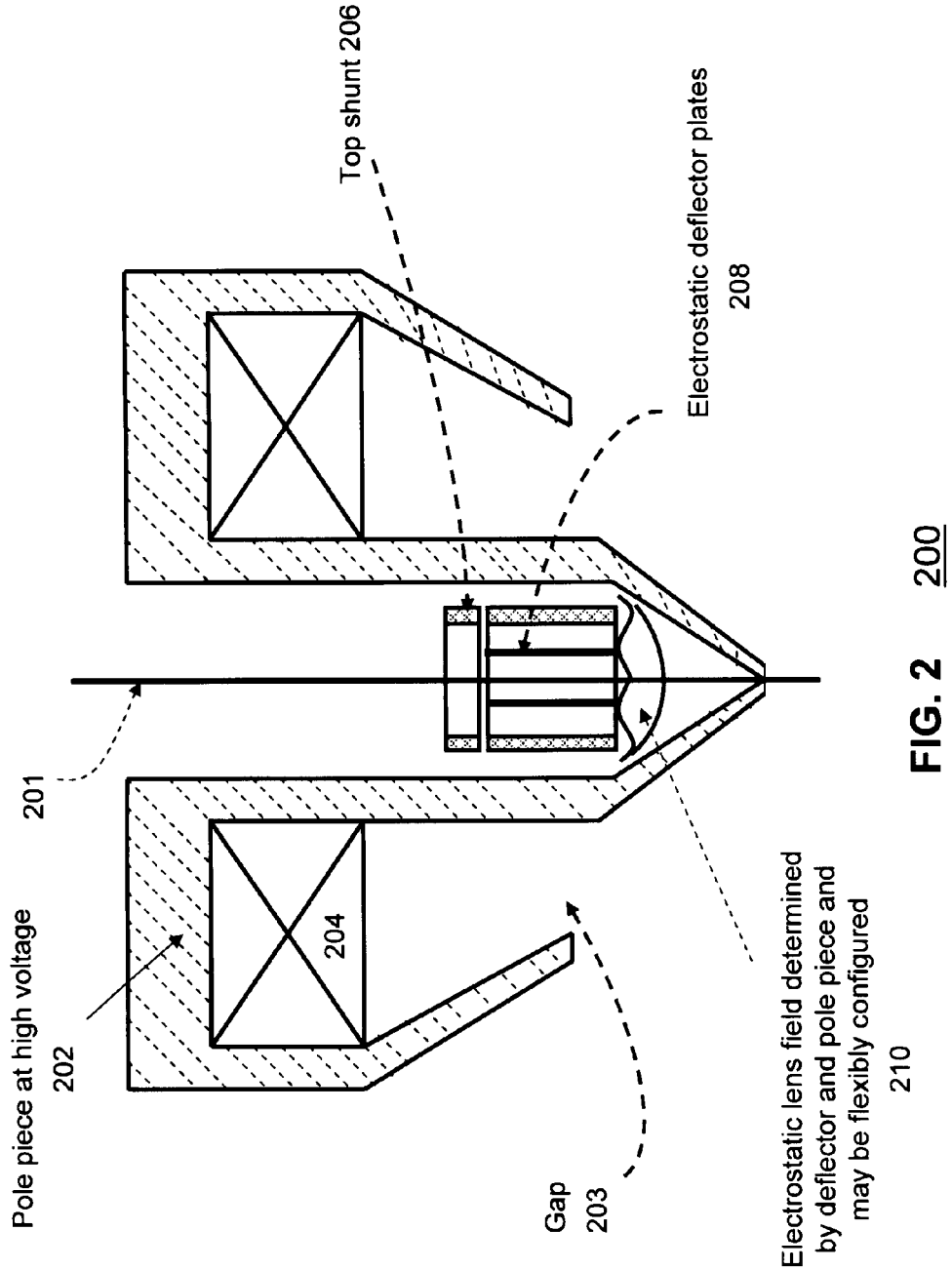
FIG. 2    200

2000 eV beam energy, 1000 eV landing energy

| FOV (um) | Octupole scan sensitivity (um/V) | Quad/octupole (V/V) | Quad to oct rotation (°) | Radial Landing angle (°) | Circumf landing angle (°) | Field curvature (um) | Astigmatism (um) | Distortion (um) | Beam blur (um) |
|---|---|---|---|---|---|---|---|---|---|
| 64 | 0.5 | -1.22 | -2.0 | -0.0001 | 0.01 | 0.08 | 0.18 | 2.11 | 0.20 |

Octupole voltage required for 64 um FOV: ±95 V
Quadrupole voltage required for 64 um FOV: ±116 V

FIG. 3

2000 eV beam energy, 1000 eV landing energy

| FOV (um) | Octupole scan sensitivity (um/V) | Quad/octupole (V/V) | Quad to oct rotation (°) | Radial Landing angle (°) | Circumf landing angle (°) | Field curvature (um) | Astigmatism (um) | Distortion (um) | Beam blur (um) |
|---|---|---|---|---|---|---|---|---|---|
| 64 | 0.7 | -1.21 | -3.0 | -0.08 | 0.07 | 0.07 | 0.09 | 0.67 | 0.11 |

Octupole voltage required for 64 um FOV: ±62 V
Quadrupole voltage required for 64 um FOV: ±75 V

FIG. 4

OBJECTIVE LENS WITH DEFLECTOR PLATES IMMERSED IN ELECTROSTATIC LENS FIELD

CROSS-REFERENCE TO RELATED APPLICATION

The present application claims the benefit of U.S. Provisional Patent Application No. 60/881,319, entitled "Objective Lens With Deflector Plates Immersed In Electrostatic Lens Field", filed Jan. 19, 2007, by inventors Alexander J. Gubbens and Ye Yang, the disclosure of which is hereby incorporated by reference in its entirety.

BACKGROUND OF THE INVENTION

1. Field of the Invention

The present invention relates to electron beam apparatus, including scanning electron microscopes and the like, and method of operating such apparatus.

2. Description of the Background Art

There is an increasing need for high-resolution scanning electron microscopes (SEMs) in all areas of development and manufacture of micro-electronic and opto-electronic components. High-resolution scanning electron microscopes are useful so as to visually evaluate sub-micrometer structures. High-resolution SEMs may be used to identify deviations from standard patterns and to acquire and evaluate topographical data such as heights, widths or angles of inclination.

Unfortunately, conventional, non-immersion, scanning electron microscopes do not have the required resolution of a few nanometers unless very high landing energies above about 10 kilo-electronVolts are used which may cause resist structures and, integrated circuits to be damaged and non-conductive or high resistant specimens to be disadvantageously charged.

It is highly desirable to improve electron beam apparatus, including scanning electron microscopes and the like, and methods of operating such apparatus.

SUMMARY

One embodiment relates to an objective lens utilizing magnetic and electrostatic fields which is configured to focus a primary electron beam onto a surface of a target substrate. The objective lens includes a magnetic pole piece and an electrostatic deflector configured within the pole piece. An electrostatic lens field is determined by the pole piece and the electrostatic deflector, and the electrostatic lens field is configured by adjusting offset voltages applied to the plates of the electrostatic deflector.

Another embodiment relates to a method of focusing an electron beam onto a target specimen. Offset voltages are applied to a main deflector so as to fine tune an electrostatic lens field, where the electrostatic lens field is determined by the offset voltages on the deflector and a high voltage on a magnetic pole piece surrounding the deflector.

Another embodiment relates to an electron beam apparatus. The apparatus includes at least an electron source, a magnetic immersion objective lens, and an electrostatic deflector. The electron source is configured to generate a primary electron beam, and the magnetic immersion objective lens is configured to focus the primary electron beam onto a surface of a target substrate. The electrostatic deflector is configured within the pole piece of the magnetic immersion objective lens. An electrostatic lens field is determined by the pole piece and the electrostatic deflector, and the electrostatic lens field is configured by adjusting offset voltages applied to plates of the electrostatic deflector.

Other embodiments, aspects and features are also disclosed.

BRIEF DESCRIPTION OF THE DRAWINGS

FIG. 2 is a schematic diagram of an immersion objective lens having electrostatic deflector plates deeply positioned therein, without a grounded shunt configured at the bottom of the deflector plates.

FIG. 3 is a table of simulation results showing performance parameters of a magnetic immersion objective lens having electrostatic deflector plates positioned therein, where a grounded shunt is configured at the bottom of the deflector plates.

FIG. 4 is a table of simulation results showing performance parameters of an immersion objective lens having electrostatic deflector plates deeply positioned therein, without a grounded shunt configured at the bottom of the deflector plates.

DETAILED DESCRIPTION

Immersion Objective Lenses

Figure 1:
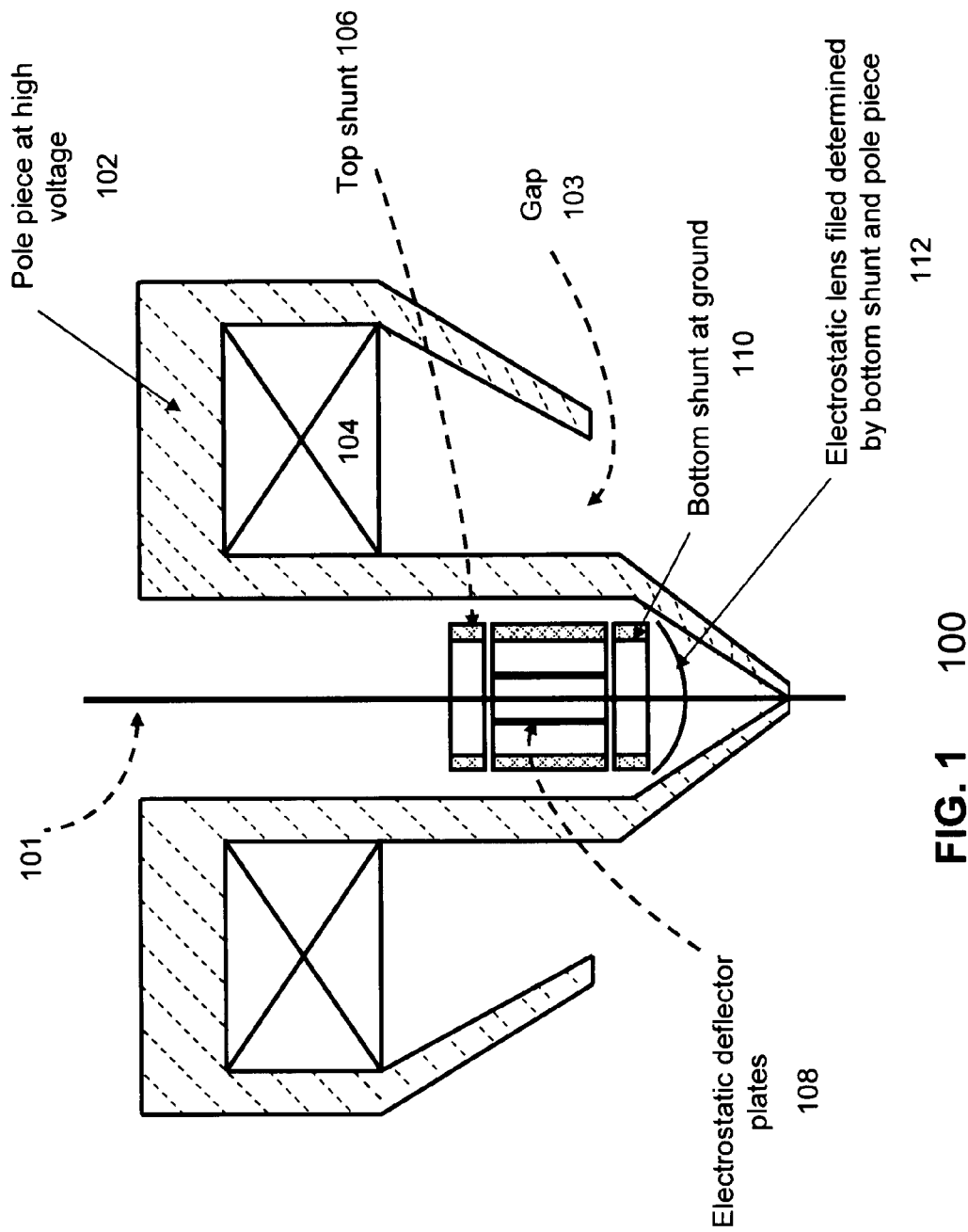
FIG. 1 is a schematic diagram of an immersion objective lens having electrostatic deflector plates positioned therein, where a grounded shunt is configured at the bottom of the deflector plates.

Low-voltage scanning electron microscopes (SEMs) often use immersion objective lenses because they tend to have superior resolution performance. Immersion objective lenses immerse the sample in a magnetic and/or decelerating electrostatic field. The highest resolution low voltage SEMs use both magnetic and electrostatic immersion. The magnetic immersion allows for very small working distances and small aberration coefficients. The use of electrostatic immersion to retard the primary electron beam just prior to the substrate further reduces the aberration coefficients and thereby further increases the resolution.

The landing energy of the primary electron beam is determined by the potential difference between the electron gun's cathode and the subsrate. The retarding field at the substrate is determined by the potential difference between the substrate and the objective lens pole piece above it.

To allow independent control of the landing energy and the retarding field, the objective lens pole piece(s) are typically biased at a high voltage potential (greater than 30 V in magnitude). The substrate potential is then set to determine the landing energy and the objective lens pole piece potential is next set to determine the strength of the retarding electrostatic field.

Scanning of the primary electron beam is conventionally done by means of a multipole deflector located on the inside of the objective lens near the tip. Electrostatic deflection is often preferred over magnetic deflection because it does not suffer from hysteresis as magnetic deflectors do and because it is easier to make work well at high speeds.

Conventional electrostatic deflectors use shunt electrodes on both sides to accurately define and terminate the axial extend of the deflecting field. The DC value of the electrostatic deflector and shunts are typically held at ground potential to allow for simpler driving electronics. This then necessarily introduces an electrostatic lens field between the objective lens pole piece at high voltage and the deflector at DC ground.

In the case of magnetic immersion, the secondary electron detection is typically through the objective lens. This is because the secondary electrons are strongly captured by the magnetic field and spiral up along the optical axis through the bore of the lens. At the point where the magnetic field decays on the inside of the lens, the secondary electrons are no longer captured and "spill out" (i.e. travel along divergent paths), making it difficult to collect and detect them.

It is therefore desirable to have an electrostatic lens on the inside of a magnetic immersion objective lens. Such an electrostatic lens on the inside of a magnetic immersion objective lens may advantageously collimate the secondary electrons and transport them more efficiently to the secondary detector located elsewhere in the electron beam column.

Magnetic Immersion Objective Lens Having an Electrostatic Deflector Plates with a Bottom Shunt Positioned Therein FIG. 1 is a schematic diagram of a magnetic immersion objective lens 100 having electrostatic deflector plates 108 positioned therein, where a grounded shunt 110 is configured at the bottom of the deflector plates 108. This diagram shows a cross-sectional view of the objective lens 100.

As shown, a primary electron beam travels down an optical axis 101 and through the objective lens 100 to become focused upon the surface of a target substrate. A magnetic pole piece 102 of the objective lens 100 is configured about the optical axis 101, with a gap 103 extending away from the optical axis 101. The pole piece 102 is configured about an electromagnetic device 104 so as to generate a magnetic field which immerses the target substrate. The pole piece 102 is further configured at a high voltage potential.

As further shown, electrostatic deflector plates 108 are configured within the pole piece 102. By controllably varying the voltages applied to the electrostatic deflector plates 108, the primary beam may be controllably deflected so as to be scanned over an area of the target substrate.

In this case, a top shunt 106 and a bottom shunt 110 are provided above and below the deflector plates 108. The top shunt 106 may comprise, for example, a conical shunt. The bottom shunt 110 may comprise, for example, a conical or straight shunt. The shunts 106 and 110 are further configured to be grounded (i.e. conductively connected to an electrical ground).

An electrostatic lens may be defined between the grounded bottom shunt electrode 110 and the high-voltage objective lens pole piece 102. This electrostatic lens may be configured so as to collimate secondary electrons emitted from the target substrate.

Unfortunately, applicants have determined that the accurate alignment of the bottom shunt electrode 110 and the pole piece 102 is needed for high resolution performance of the objective lens 100 shown in FIG. 1. This requirement drives mechanical tolerances that are on the order of micrometers and adds substantially to the manufacturing cost of the magnetic lens.

Magnetic Immersion Objective Lens Having an Electrostatic Deflector Plates Positioned Lower in the Lens FIG. 2 is a schematic diagram of an immersion objective lens 200 having electrostatic deflector plates 208 deeply positioned therein, without a grounded shunt configured at the bottom of the deflector plates 208. This diagram shows a cross-sectional view of the objective lens 200.

As shown, a primary electron beam travels down an optical axis 201 and through the objective lens 200 to become focused upon the surface of a target substrate. A magnetic pole piece 202 of the objective lens 200 is configured about the optical axis 201, with a gap 203 extending away from the optical axis 201. The pole piece 202 is configured about an electromagnetic device 204 so as to generate a magnetic field which immerses the target substrate. The pole piece 202 is further configured at a high voltage potential.

As further shown, electrostatic deflector plates 208 are configured within the pole piece 202. By controllably varying the voltages applied to the electrostatic deflector plates 208, the primary beam may be controllably deflected so as to be scanned over an area of the target substrate.

In this case, a top shunt 206 is provided above the deflector plates 208, but there is no bottom shunt (in contrast to FIG. 1). The top shunt 106 may comprise, for example, a conical shunt.

Here, an electrostatic lens field 210 may be defined between the electrostatic deflector plates 208 and the high-voltage objective lens pole piece 202. Advantageously, applicants have determined that, unlike the electrostatic lens field 110 of FIG. 1, the electrostatic lens field 210 of FIG. 2 does not require highly-accurate alignment of the deflector plates 208 and the high-voltage objective lens pole piece 202. This is because the ends of the deflector plates 208 are immersed in the electrostatic field 210.

Because the ends of the deflector plates 208 are immersed in the electrostatic field 210, the electrostatic field 210 may be controllably adjusted by applying DC voltages to all of the deflector plates 208. These DC voltages may be used to properly align the electrostatic field 210 within the objective lens 200. While the DC voltages applied to all of the deflector plates 208 may be adjusted to change the alignment of the electrostatic field 210, it does not affect the scanning of the electron beam which is controlled by the AC voltage (i.e. the time-varying voltage signal) applied to one or more of the deflector plates 208.

Applicants have determined that the lens configuration of FIG. 2 allows for significantly greater mechanical tolerances for the same high resolution performance. The greater mechanical tolerances are enabled by the advantageous feature that the shape and alignment of the electrostatic lens field 210 may be controllably varied and fine-tuned by applying the DC voltages to the deflector plates 208.

As a result, the mechanical tolerances of the objective lens may be relaxed while the resolution performance may be maintained or even improved. Relaxation of the mechanical tolerances greatly reduces manufacturing cost.

Simulation Results

FIG. 3 is a table of simulation results showing performance parameters of a magnetic immersion objective lens having electrostatic deflector plates positioned therein, where a grounded shunt is configured at the bottom of the deflector plates (like the objective lens 100 of FIG. 1). In contrast, FIG. 4 is a table of simulation results showing performance parameters of an immersion objective lens having electrostatic deflector plates deeply positioned therein, without a grounded shunt configured at the bottom of the deflector plates (like the objective lens 200 of FIG. 2).

Note that these simulations included both octupole and quadrupole electrostatic lens characteristics. The octupole and quadrupole are shifted downward (closer to the target substrate) for the simulation of FIG. 4 in comparison to the simulation of FIG. 3. As indicated, the primary beam energy is 2,000 electron Volts, and the landing energy is 1,000 electron Volts, for both of these simulations.

Comparing the results shows that removing the bottom shunt and moving the deflectors down increases the scan sensitivity. The higher scan sensitivity results in an approximately 35% reduction in scan voltages required. Moreover, the scan aberrations are reduced by a factor of 2 or 3. This is advantageously accomplished while the secondary electron collection efficiency is unaffected (as shown by a separate simulation).

The simulations show that leaving out the bottom shunt and immersing the electrostatic deflector plates in the electrostatic lens field not only allows the mechanical tolerances of the objective lens to be reduced, it actually also increases the scanning performance of the electron microscope.

CONCLUSION

As integrated circuits continue to get smaller and smaller with the progression down Moore's curve, the resolution requirements on critical dimension and review SEMs continue to increase. Increasing resolution requirements impose tighter and tighter mechanical tolerances on the lens design of immersion objective lenses. The present application discloses methods and apparatus to introduce an additional degree of freedom that may be utilized to ensure optimal alignment and resolution performance. This advantageously reduces required mechanical tolerances and improves the manufacturability of a combined magnetic/electrostatic objective lens for scanning electron microcopy.

The above-described diagrams are not necessarily to scale and are intended be illustrative and not limiting to a particular implementation. Specific dimensions, geometries, and lens currents of the immersion objective lens will vary and depend on each implementation.

The above-described invention may be used in an automatic inspection system and applied to the inspection of wafers, X-ray masks and similar substrates in a production environment. While it is expected that the predominant use of the invention will be for the inspection of wafers, optical masks, X-ray masks, electron-beam-proximity masks and stencil masks, the techniques disclosed here may be applicable to the high speed electron beam imaging of any material (including perhaps biological samples).

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An electron beam apparatus comprising:
    an electron source for generating a primary electron beam;
    a magnetic immersion objective lens configured to focus the primary electron beam onto a surface of a target substrate;
    a pole piece of the magnetic immersion objective lens;
    an electrostatic deflector including a plurality of plates configured within the pole piece;
    an electrostatic lens field determined by the pole piece and the electrostatic deflector, wherein the electrostatic lens field is configured to be controllably adjusted by applying DC offset voltages to all of the plates of the electrostatic deflector;
    a top shunt configured within the pole piece above the electrostatic deflector such that the primary electron beam passes through an opening in the top shunt before passing through the electrostatic deflector,
    wherein a high voltage is applied to the pole piece, and
    wherein the top shunt is conductively connected to an electrical ground.

2. The apparatus of claim 1, wherein a time-varying voltage is also applied to at least one plate of the electrostatic deflector so as to controllably scan the primary electron beam over an area of the target substrate.

3. The apparatus of claim 2, wherein secondary electrons are emitted from the target substrate due to impingement of the primary electron beam, and wherein the electrostatic lens field collimates the secondary electrons on their way towards a detector.

4. The apparatus of claim 1, wherein a gap of the pole piece extends away from an optical axis of the objective lens so that the surface of the target substrate is immersed in a magnetic field.

5. The apparatus of claim 1, further comprising circuitry to adjust the offset voltages applied to the plates of the electrostatic deflector.

6. The apparatus of claim 1, wherein the top shunt is a conical shunt.

7. The apparatus of claim 1, further comprising:
    a bottom shunt configured within the pole piece below the electrostatic deflector such that the primary electron beam passes through an opening in the bottom shunt after passing through the electrostatic deflector,
    wherein the bottom shunt is conductively connected to the electrical ground.

8. The apparatus of claim 7, wherein the top shunt is a conical shunt, and wherein the bottom shunt is a conical or straight shunt.

9. An objective lens utilizing magnetic and electrostatic fields which is configured to focus a primary electron beam onto a surface of a target substrate, the objective lens comprising:
    a magnetic pole piece;
    an electrostatic deflector configured within the pole piece;
    an electrostatic lens field determined by the pole piece and the electrostatic deflector, wherein the electrostatic lens field is configured to be controllably adjusted by applying DC offset voltages to all plates of the electrostatic deflector;
    a top shunt configured within the pole piece above the electrostatic deflector such that the primary electron beam passes through an opening in the top shunt before passing through the electrostatic deflector,
    wherein a high voltage is applied to the pole piece, and
    wherein the top shunt is conductively connected to an electrical ground.

10. The objective lens of claim 9, wherein a time-varying voltage is also applied to at least one plate of the electrostatic deflector so as to controllably scan the primary electron beam over an area of the target substrate.

11. The objective lens of claim 10, wherein secondary electrons are emitted from the target substrate due to impingement of the primary electron beam, and wherein the electrostatic lens field collimates the secondary electrons on their way towards a detector.

12. The objective lens of claim 9, wherein a gap of the pole piece extends away from an optical axis of the objective lens so that the surface of the target substrate is immersed in a magnetic field.

13. The objective lens of claim 9, further comprising:
a bottom shunt configured within the magnetic pole piece below the electrostatic deflector such that the primary electron beam passes through an opening in the bottom shunt after passing through the electrostatic deflector,
wherein a high voltage is applied to the magnetic pole piece, and
wherein the top and bottom shunts are conductively connected to an electrical ground.

14. The objective lens of claim 13, wherein the top shunt is a conical shunt, and wherein the bottom shunt is a conical or straight shunt.

15. A method of focusing an electron beam onto a target specimen, the method comprising:
applying a high voltage on a magnetic pole piece;
applying electrical ground to a top shunt within the magnetic pole piece;
adjusting DC offset voltages applied to a main deflector which is below the top shunt within the magnetic pole piece, the DC offset voltages being adjusted so as to fine tune an electrostatic lens field determined by the DC offset voltages on the deflector and the high voltage on the magnetic pole piece surrounding the deflector; and
passing the electron beam through an opening in the top shunt and through the main deflector.

16. The method of claim 15, wherein the method is applied to a magnetic immersion objective lens.

17. The method of claim 16, wherein the magnetic immersion objective lens is configured within an apparatus for automated inspection or review of manufactured substrates.

18. The method of claim 15, further comprising:
applying electrical ground to a bottom shunt below the main deflector within the magnetic pole piece; and
passing electron beam through an opening in the bottom shunt.

* * * * *